United States Patent
Kim

(10) Patent No.: US 8,895,391 B2
(45) Date of Patent: Nov. 25, 2014

(54) METHOD OF MANUFACTURING SEMICONDUCTOR MEMORY DEVICE

(75) Inventor: Won Ki Kim, Icheno-si (KR)

(73) Assignee: SK Hynix Inc., Gyeonggi-do (KR)

( * ) Notice: Subject to any disclaimer, the term of this patent is extended or adjusted under 35 U.S.C. 154(b) by 183 days.

(21) Appl. No.: 13/601,805

(22) Filed: Aug. 31, 2012

(65) Prior Publication Data

US 2013/0244398 A1     Sep. 19, 2013

(30) Foreign Application Priority Data

Mar. 14, 2012 (KR) .................... 10-2012-0026117

(51) Int. Cl.
*H01L 29/788* (2006.01)
*H01L 21/335* (2006.01)

(52) U.S. Cl.
USPC ........................................ 438/264; 438/296

(58) Field of Classification Search
CPC ................. H01L 29/66825; H01L 29/788
USPC ............ 257/288, 294, 296, 257, 264, 266, 257/E21.423, E21.422, E21.309, E21.3; 438/288, 294, 296, 257, 264, 266
See application file for complete search history.

(56) References Cited

U.S. PATENT DOCUMENTS

| | | | |
|---|---|---|---|
| 6,337,245 B1* | 1/2002 | Choi | 438/258 |
| 2004/0157422 A1* | 8/2004 | Han | 438/594 |
| 2007/0141785 A1* | 6/2007 | Choi | 438/264 |
| 2007/0155095 A1* | 7/2007 | Kim | 438/257 |
| 2007/0184616 A1* | 8/2007 | Yoo et al. | 438/266 |
| 2007/0218619 A1* | 9/2007 | Cha et al. | 438/201 |
| 2008/0006872 A1* | 1/2008 | Kang et al. | 257/321 |
| 2008/0230830 A1* | 9/2008 | Kim et al. | 257/324 |
| 2009/0141562 A1* | 6/2009 | Jeon et al. | 365/185.28 |
| 2009/0315099 A1* | 12/2009 | Park et al. | 257/324 |
| 2010/0213536 A1* | 8/2010 | Nakanishi et al. | 257/324 |
| 2011/0189829 A1* | 8/2011 | Yun et al. | 438/266 |

* cited by examiner

*Primary Examiner* — Michele Fan
(74) *Attorney, Agent, or Firm* — William Park & Associates Patent Ltd.

(57) ABSTRACT

The present disclosure relates to a method of manufacturing a semiconductor memory device, the method including: forming isolation layers in trenches dividing active regions of a substrate; depositing a tunnel insulating layer and a charge storing layer on an entire structure including the isolation layers; forming mask patterns on the charge storing layer to cover the active regions and to expose the isolation layers; and etching the charge storing layer by using the mask patterns as an etch barrier, thereby forming charge storing layer patterns on the active regions.

6 Claims, 5 Drawing Sheets

METHOD OF MANUFACTURING SEMICONDUCTOR MEMORY DEVICE

CROSS-REFERENCE TO RELATED APPLICATION

Priority to Korean patent application number 10-2012-0026117 filed on Mar. 14, 2012, the entire disclosure of which is incorporated by reference herein, is claimed.

BACKGROUND

The present invention relates generally to a method of manufacturing a semiconductor memory device, and more particularly to a method of manufacturing a NAND flash memory device.

In order to manufacture a highly-integrated semiconductor memory device, fine patterns have been formed on a semiconductor substrate. Due to these fine patterns, various process failures occur. For example, a NAND flash memory device comprises of a stacked gate on a semiconductor substrate, which includes a tunnel insulating layer, a charge storing layer, a dielectric layer, and a control gate layer. The stacked gate is generally formed by a method described below.

A tunnel insulating layer and a charge storing layer are deposited on the semiconductor substrate, which includes active regions divided by isolation regions. The isolation regions of the semiconductor substrate may be exposed by etching the charge storing layer and the tunnel insulating layer.

Trenches are formed in the semiconductor substrate by etching the exposed isolation regions of the semiconductor substrate, and isolating layers are formed in the trenches. As a result, the active regions are divided by the isolation layers, and the tunnel insulating layer and the charge storing layer collectively are divided by the isolation layers and remain on the active regions.

A dielectric layer and the control gate layer are deposited on the entire structure, including on the isolation layers. Subsequently, gate mask patterns are formed on the control gate layer in a direction crossing the isolation layers and the active regions, and thus the control gate layer, the dielectric layer, and the charge storing layer are etched by using the gate mask patterns as an etch barrier. As a result, the charge storing layer on the active regions is divided into a plurality of charge storing layer segments. Additionally, control gate layer line patterns applied in a direction crossing the active regions and the isolation layers form patterns on the charge storing layer.

According to the aforementioned conventional art, the trenches are defined by an etched region from the charge storing layer to the semiconductor substrate. Therefore, the aspect ratio for each trench is high. Pattern failure, such as generation of a void, may thus occur. Due to higher integration, the aspect ratio for each trench increases, causing greater difficulties to form patterns.

SUMMARY

The present disclosure provides a method of manufacturing a semiconductor memory device capable of solving pattern failure.

An embodiment of the present disclosure provides a method of manufacturing a semiconductor memory device, which includes: forming isolation layers in trenches dividing active regions of a substrate; depositing a tunnel insulating layer and a charge storing layer on an entire structure including the isolation layers; forming mask patterns on the charge storing layer to cover the active regions and to expose the isolation layers; and etching the charge storing layer by using the mask patterns as an etch barrier, thereby forming charge storing layer patterns on the active regions.

DETAILED DESCRIPTION

Hereinafter, an embodiment of the present invention will be described with reference to the accompanying drawings in detail. However, the present invention is not limited to an embodiment disclosed below, and may be implemented in various forms. The embodiment is provided only for illustrative purposes and for full understanding of the scope of the present invention by those skilled in the art, and the scope of the present invention will be understood by the claims of the present invention.

FIGS. 1A to 1I are cross-sectional views illustrating a method of manufacturing a semiconductor memory device according to an embodiment of the present invention. Specifically, FIGS. 1A to 1I are cross-sectional views illustrating a memory cell array region of a NAND flash memory device taken along a direction of crossing active regions.

Figure 1A:
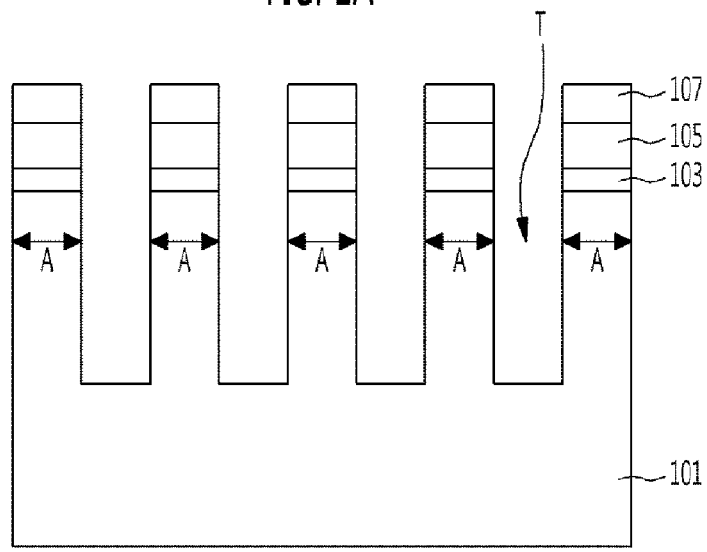
FIGS. 1A to 1I are cross-sectional views illustrating a method of manufacturing a semiconductor memory device according to an embodiment of the present invention.

Referring to FIG. 1A, trenches T by segmenting active regions A are formed in a semiconductor substrate 101. An example of a process of forming the trenches T will be described in detail below.

A screen oxide layer 103 is formed on the semiconductor substrate 101, followed by an injection of an impurity to a predetermined depth in the substrate to adjust the threshold voltage of a memory cell. The screen oxide layer 103 may serve to protect the areas above the trenches during the impurity injection process.

An etching stopping layer 105 is formed on the screen oxide layer 103, followed by a formation of first mask patterns 107 on the etching stopping layer 105. The etching stopping layer 105, which may be formed of a nitride layer, functions as a stopping layer in a subsequent process of planarizing an insulating material outside trenches T.

To form the first mask patterns 107, a first mask layer is first formed on the etch stopping layer 105, and then sacrificial patterns are arranged with a predetermined pitch on the first mask layer through a photo lithography process. Spacers are formed on side walls of the sacrificial patterns, the sacrificial patterns are removed, and the first mask layer is patterned using the spacers as an etch barrier. The first mask patterns 107 may be formed to have a finer pitch than that of the sacrificial patterns. Alternatively, the first mask patterns 107 may be formed by etching the first mask layer with photo resist patterns serving as an etch barrier through the photo lithography process. The first mask layer is formed of a material, such as oxide, that has a great etch selectivity for the semiconductor substrate 101 so as to serve as the etch barrier during the process of etching the semiconductor substrate 101.

After forming the first mask patterns 107, the etching stopping layer 105, the screen oxide layer 103, and the semiconductor substrate 101 are all etched with the first mask patterns 107 serving as an etch barrier. Accordingly, the trenches T having a predetermined depth are formed in the semiconductor substrate 101, and the active regions A of the semiconductor substrate 101 are divided by the trenches T. The active regions A may be formed with the same pitch as that of the first mask patterns 107.

Figure 1B:
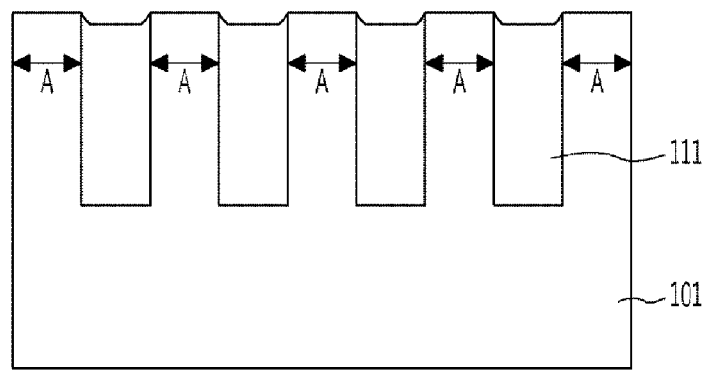

Referring to FIG. 1B, isolation layers 111 are formed in the trenches T. An example of a process of forming the isolation layers 111 is described below.

An insulating material is formed with a sufficient depth to completely bury the trenches T throughout the entire structure. The insulating material may be formed by depositing and hardening a flowable material layer, such as polysilazane (PSZ), into trenches T.

The insulating material on the active regions A is removed, and a planarization process, such as a Chemical Mechanical Polishing (CMP) process, is performed until the etching stopping layer 105 is exposed in such a manner that the insulating material remains in the trenches T. The etching stopping layer 105 is removed by a wet etching method or a dry etching method. The screen oxidization layer 103 may be removed, and the insulating material may be partially etched. As a result, the isolation layers 111 as depicted in FIG. 1B, are formed. The heights of the isolation layers 111 may be formed to be shorter than those of the active regions A.

As described above, since the trenches T are formed without introducing the charge storing layer as part of the present invention, the aspect ratio for each trench T may be reduced, thereby reducing pattern failure and the generation of the voids in the isolation layers 111. Thus, retention property of a cell may be improved.

Further, the aspect ratio of the pattern isolated by the trenches T (each of the active regions A of the semiconductor substrate 101 in the present invention) may be decreased compared to the case in which the trenches T are formed after the forming of the charge storing layer. Thus, a leaning phenomenon that the active regions A are leaned due to a high aspect ratio of the pattern isolated by the trenches T may be solved.

Figure 1C:
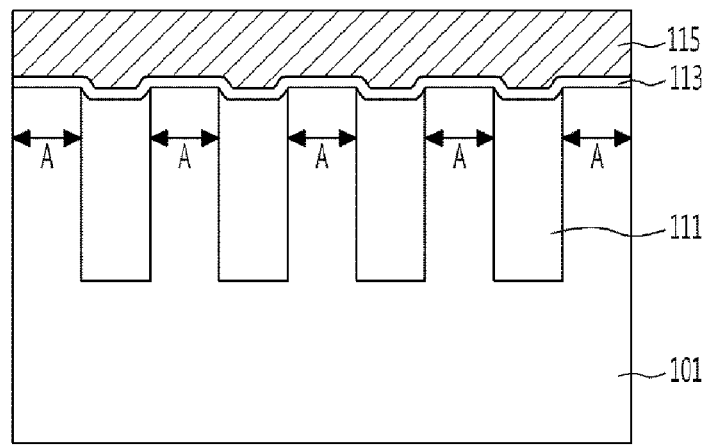

Referring to FIG. 1C, the tunnel insulating layer 113 and the charge storing layer 115 are deposited on the entire structure including the isolation layers 111. The tunnel insulating layer 113 may be formed of a silicon oxide layer, and the charge storing layer 115 may be formed of an undoped or doped poly silicon layer for a floating gate.

Figure 1D:
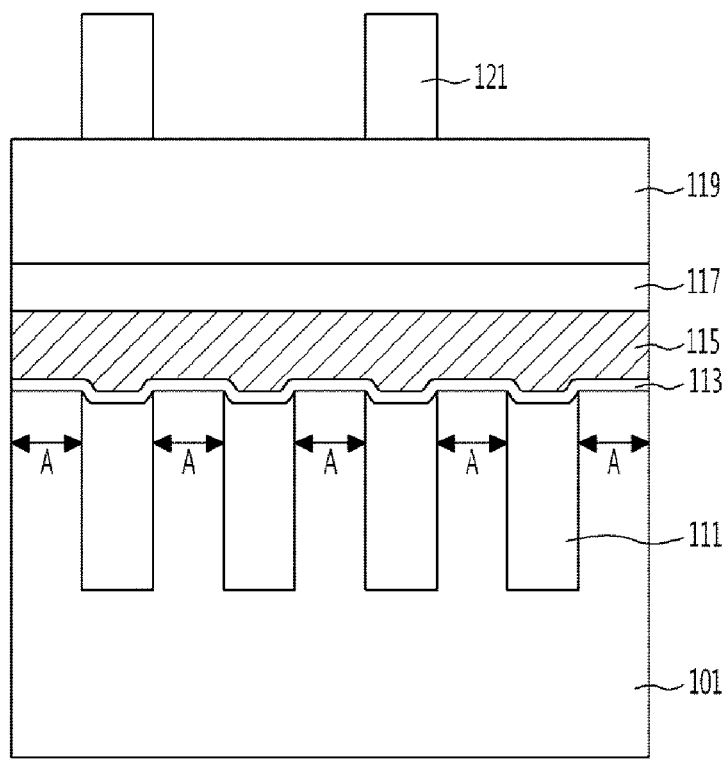

Referring to FIG. 1D, a second mask layer 117 and a sacrificial pattern material layer 119 are deposited on the charge storing layer 115.

The second mask layer 117 is formed of a material layer having a great etch selectivity from that of the charge storing layer 115 so that the second mask layer 117 may serve as an etch barrier in a subsequent process of etching the charge storing layer 115. For example, the charge storing layer 115 may be formed of a poly silicon layer, and the second mask layer 117 may be formed of an oxide layer.

The sacrificial pattern material layer 119 is formed of a material layer having a great etch selectivity to the second mask layer 117. For example, the sacrificial pattern material layer 119 may be formed of an amorphous carbon layer.

Photo resist patterns 121 are formed on the sacrificial pattern material layer 119 above the isolation layers 111 through the photo lithography process. For example, the photo resist patterns 121 may be formed above the odd or even numbered isolation layers. The photo resist patterns 121 extend in the same direction as those of the isolation layers 111.

Figure 1E:
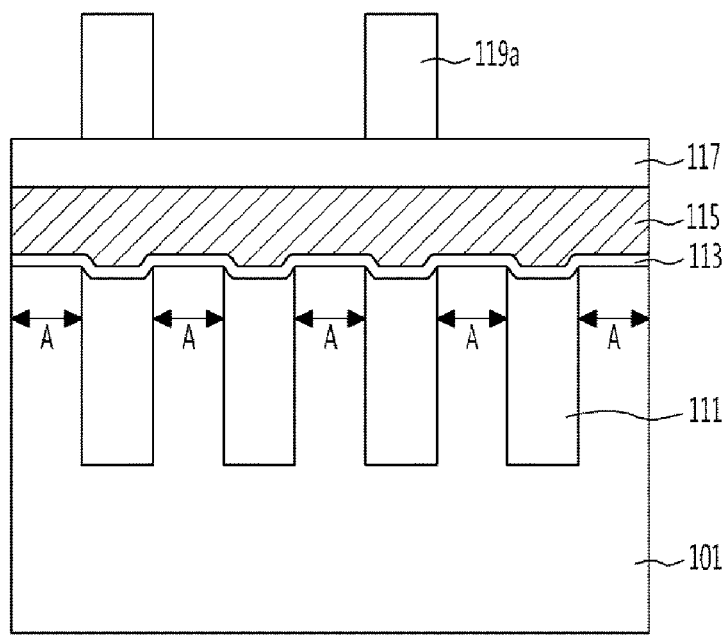

Referring to FIG. 1E, sacrificial patterns 119a are formed above the isolation layers 111 by etching the sacrificial pattern material layer 119 with the photo resist patterns 121 serving as the etch barrier. For example, the sacrificial patterns 119a may be formed above the odd or even numbered isolation layers.

Figure 1F:
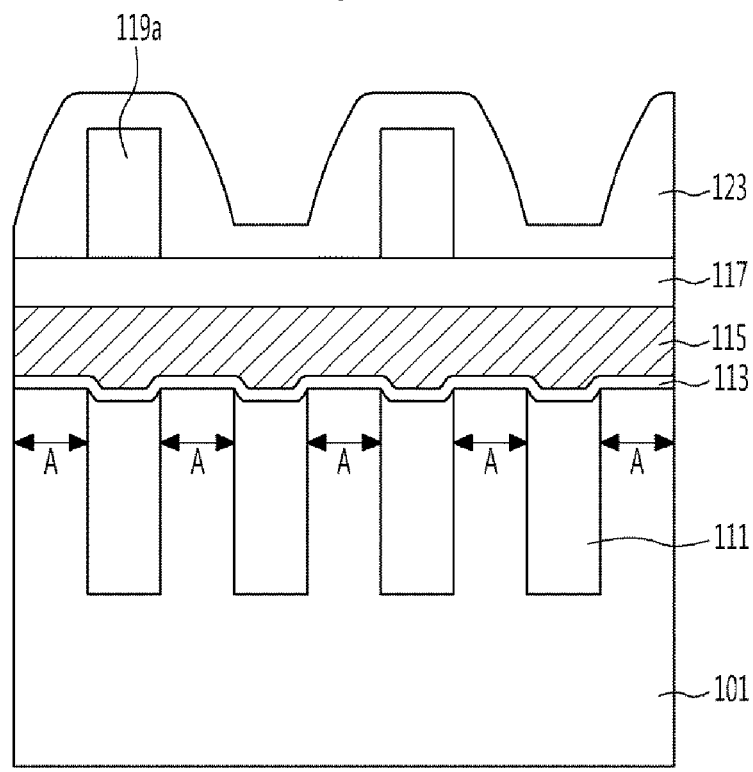

Referring to FIG. 1F, a spacer layer 123 is formed along a surface of the entire structure including the sacrificial patterns 119a. The spacer layer 123 is formed of a material layer having a great etch selectivity to that of the sacrificial patterns 119a so that the spacer layer 123 is not removed in a subsequent etching process of removing the sacrificial patterns 119a. For example, the spacer layer 123 may be formed of an oxide layer. The spacer layer 123 formed on a side walls of the sacrificial patterns 119a may be formed with a thickness sufficient to cover the active regions A. For example, the spacer layer 123 may be formed to have a thickness equivalent to a width of each active region A.

Figure 1G:
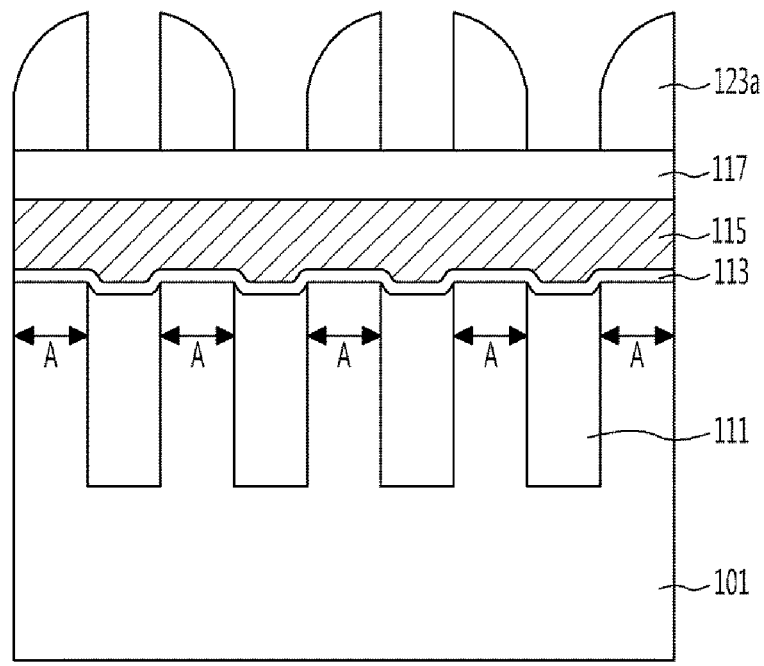

Referring to FIG. 1G, top surfaces of the sacrificial patterns 119a are exposed and the spacer layer 123 remains on the side walls of the sacrificial patterns 119a by etching the spacer layer 123 through the etching process, such as an etch back process. Spacer layer patterns remaining on the side walls of the sacrificial patterns 119a are defined as spacers 123a. The sacrificial patterns 119a are subsequently removed through the etching process. Accordingly, the spacers 123a are formed so that the spacers 123a expose the second mask layer 117 on the isolation layers 111 and cover the second mask layer 117 on the active regions A.

Figure 1H:
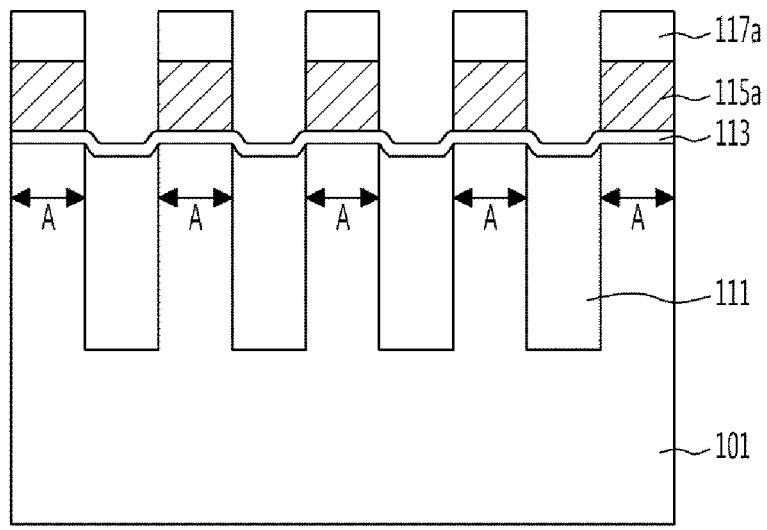

Referring to FIG. 1H, second mask patterns 117a are formed by etching the second mask layer 117 through the etching process with the spacers 123 serving as an etch barrier. The second mask patterns 117a may be formed with a fine and uniform width and distance. The spacers 123a may be removed during the etching process for forming the second mask patterns 117a or through a separate etching process after the forming of the second mask patterns 117a. The charge storing layer 115 on the active regions A is covered and the charge storing layer 115 on the isolation layers 111 is simultaneously exposed by the second mask patterns 117a.

First charge storing layer patterns 115a are formed above active regions A by etching the exposed region of the charge storing layer 115 through the etching process with the second mask patterns 117a serving as an etch barrier.

Figure 1I:
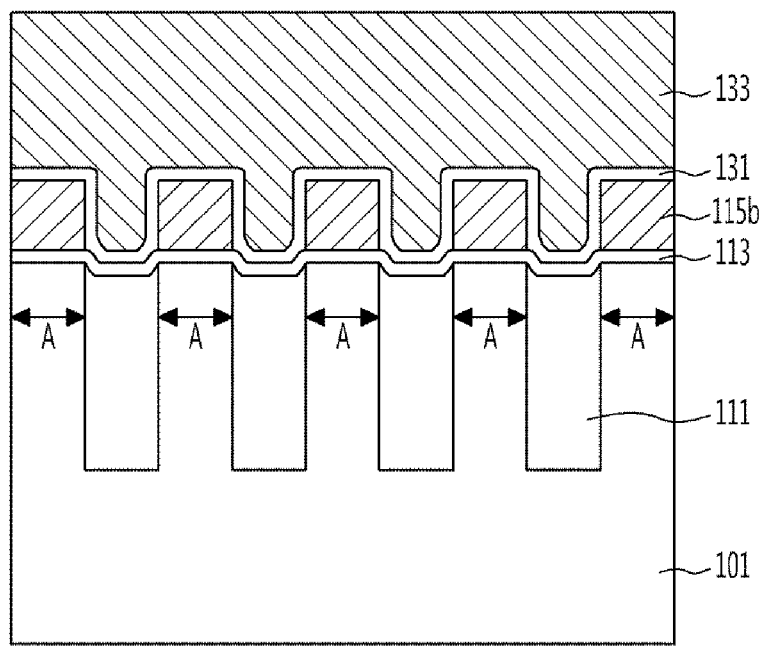

Referring to FIG. 1I, after removing the second mask patterns 117, a dielectric layer 131 is formed along a surface of the entire structure including the first charge storing layer patterns 115a. Subsequently, a control gate layer 133 is formed with a thickness sufficient to fill spaces between the first charge storing layer patterns 115a on the dielectric layer 131.

A third mask pattern (not shown) is formed on the control gate layer 133 in a direction crossing the active regions A and the isolation layers 111. The control gate layer 133, the dielectric layer 131, and the first charge storing layer patterns 115a are etched through the etching process with the third mask pattern serving as an etch barrier. As a result, the control gate layer 133 is patterned in the form of line in a direction crossing the active regions A and the element isolation layers 111, the first charge storing layer patterns 115a are patterned in second charge storing layer patterns 115b remaining only in crossing portions of the active regions A and the control gate layer 133 patterned in the form of line. and, the tunnel insulating layer 113 may remain on the surfaces of the isolation layers 111, as well as the surfaces of the active regions A.

Figure 2:
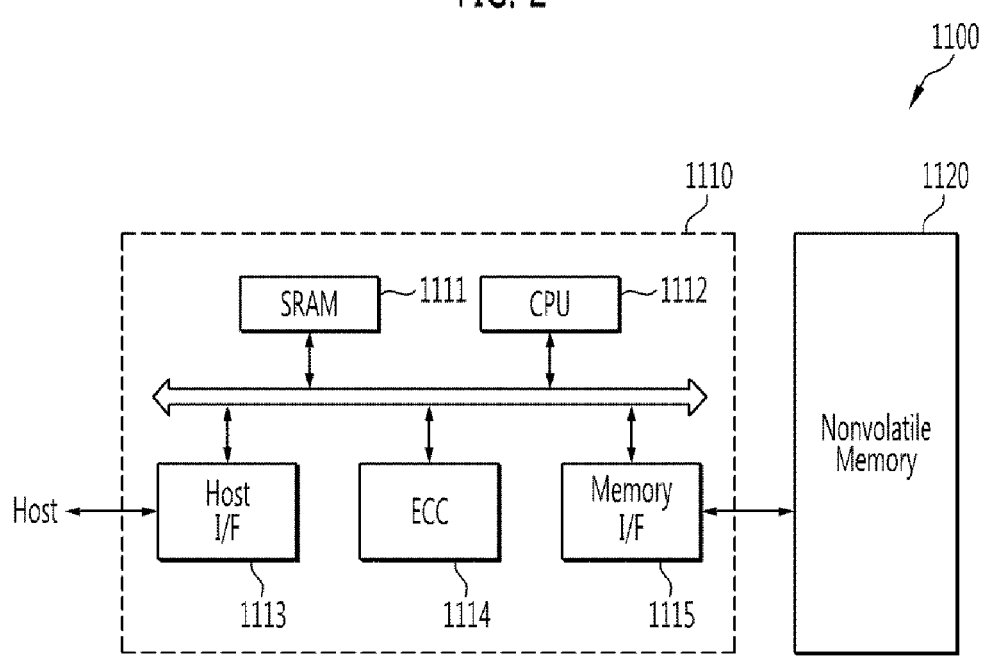
FIG. 2 is a diagram illustrating a memory system according to an embodiment of the present invention.

FIG. 2 is a diagram illustrating a memory system according to an embodiment of the present invention.

Referring to FIG. 2, a memory system 1100 according to an embodiment of the present invention includes a nonvolatile memory device 1120 and a memory controller 1110.

The nonvolatile memory device 1120 includes the nonvolatile memory device in the embodiment described with reference to FIGS. 1A to 1I. The nonvolatile memory device 1120 may additionally include, for example, a multi-chip package configured with a plurality of flash memory chips.

The memory controller 1110 is configured so as to control the nonvolatile memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol for a host connected with the memory system 1100. The ECC 1114 detects and corrects an error included in a data read from the nonvolatile memory device 1120, and the memory interface 1115 interfaces with the nonvolatile memory device 1120. In addition, the memory controller 1110 may further include for example, an RCM for storing code data for interfacing with the host.

The memory system 1100 having the aforementioned construction may be, for example, a memory card or a Solid State Disk (SSD) in which the nonvolatile memory device 1120 is combined with the controller 1110. For example, when the memory system 1100 is an SSD, the memory controller 1110 may communicate with the outside (e.g., the host) through one among various interface protocols, such as USB, MMC, PCI-E, SATA, PATA, SCSI, ESDI, and IDE.

According to the various embodiments of the present invention, the isolation layers are formed in the trenches of the substrate before the charge storing layer is formed. As a result, the aspect ratio for each trench may be reduced, and the generation of voids in the process of forming the isolation layers in the trenches may be reduced. Therefore, pattern failure caused by the voids may be avoided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing a semiconductor memory device, the method comprising:
    forming isolation layers in trenches dividing active regions of a substrate;
    depositing a tunnel insulating layer and a charge storing layer on an entire structure including the isolation layers;
    forming mask patterns on the charge storing layer to cover the active regions and expose the isolation layers; and
    etching the charge storing layer by using the mask patterns as an etch barrier, thereby forming charge storing layer patterns on the active regions,
    wherein the forming of the mask patterns comprises forming a mask layer on the charge storing layer, forming sacrificial patterns on the mask layer to cover odd numbered or even numbered isolation layers among the isolation layers, forming spacers on side walls of the sacrificial patterns, removing the sacrificial patterns, and etching the mask layer by using the spacers as an etch barrier.

2. The method as claimed in claim 1, wherein the isolation layers are formed to be lower in height than the active regions.

3. The method as claimed in claim 1, further comprising:
    forming a dielectric layer along a surface of an entire structure in which the charge storing layer patterns are exposed after the forming of the charge storing layer patterns;
    forming a control gate layer on the dielectric layer; and
    patterning the control gate layer, the dielectric layer, and the charge storing layer patterns in a direction crossing the active regions and the isolation layers.

4. The method as claimed in claim 3, wherein in the patterning of the control gate layer, the dielectric layer, and the charge storing layer patterns, the tunnel insulating layer remains on surfaces of the isolation layers and surfaces of the active regions.

5. The method as claimed in claim 1, wherein the forming of the isolation layers comprises filing the trenches with polysilazane (PSZ).

6. The method as claimed in claim 1, wherein the charge storing layer is formed of a poly silicon layer.

* * * * *